(12) United States Patent
Kruppa et al.

(10) Patent No.: US 9,634,207 B2
(45) Date of Patent: Apr. 25, 2017

(54) SEMICONDUCTOR COMPONENT AND METHOD OF PRODUCING A SEMICONDUCTOR COMPONENT

(71) Applicant: OSRAM Opto Semiconductors GmbH, Regensburg (DE)

(72) Inventors: Michael Kruppa, Geisenfeld (DE); Simon Jerebic, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/146,984

(22) Filed: May 5, 2016

(65) Prior Publication Data

US 2016/0247986 A1  Aug. 25, 2016

Related U.S. Application Data

(62) Division of application No. 13/703,180, filed as application No. PCT/EP2011/058580 on May 25, 2011, now Pat. No. 9,368,699.

(30) Foreign Application Priority Data

Jun. 22, 2010  (DE) .................. 10 2010 024 545

(51) Int. Cl.
  *H01L 33/00* (2010.01)
  *H01L 33/58* (2010.01)
  (Continued)

(52) U.S. Cl.
  CPC ........ *H01L 33/58* (2013.01); *B29D 11/00442* (2013.01); *G02B 1/04* (2013.01); *G02B 27/095* (2013.01); *H01L 33/483* (2013.01);

*H01L 33/486* (2013.01); *H01L 33/501* (2013.01); *H01L 33/507* (2013.01); *H01L 33/52* (2013.01);
  (Continued)

(58) Field of Classification Search
  None
  See application file for complete search history.

(56) References Cited

U.S. PATENT DOCUMENTS 7,455,461 B2   11/2008  Höhn et al.
8,247,263 B2    8/2012  Braune et al.
(Continued)

FOREIGN PATENT DOCUMENTS

CN  101591472 A  12/2009
DE  100 23 353 A1  11/2001
(Continued)

OTHER PUBLICATIONS

English translation of Taiwanese Notification for the Opinion of Examination dated Aug. 6, 2014 of corresponding Taiwanese Patent Application No. 100121392.
(Continued)

*Primary Examiner* — Minh-Loan Tran
(74) *Attorney, Agent, or Firm* — DLA Piper LLP (US)

(57) ABSTRACT

A method of producing a semiconductor component includes providing an optoelectronic semiconductor chip; applying a molding compound for an optical element, wherein the molding compound is based on a highly refractive polymer material; precuring the molding compound at a temperature of at most 50° C.; and curing the molding compound.

6 Claims, 7 Drawing Sheets

(51) Int. Cl.
    H01L 33/50    (2010.01)
    H01L 33/48    (2010.01)
    H01L 33/52    (2010.01)
    B29D 11/00    (2006.01)
    G02B 1/04     (2006.01)
    H01L 33/54    (2010.01)
    H01L 33/56    (2010.01)
    G02B 27/09    (2006.01)
    H01L 33/62    (2010.01)

(52) U.S. Cl.
    CPC .............. *H01L 33/54* (2013.01); *H01L 33/56* (2013.01); *H01L 33/50* (2013.01); *H01L 33/62* (2013.01); *H01L 2224/32245* (2013.01); *H01L 2224/48091* (2013.01); *H01L 2224/48247* (2013.01); *H01L 2224/73265* (2013.01); *H01L 2224/8592* (2013.01); *H01L 2933/005* (2013.01); *H01L 2933/0058* (2013.01)

(56) References Cited

U.S. PATENT DOCUMENTS

| | | | |
|---|---|---|---|
| 2005/0058773 | A1 | 3/2005 | Hasei et al. |
| 2007/0034833 | A1 | 2/2007 | Parce et al. |
| 2007/0274636 | A1 | 11/2007 | Blümel |
| 2008/0197376 | A1 | 8/2008 | Bert et al. |
| 2008/0210965 | A1 | 9/2008 | Hung |
| 2009/0065792 | A1 | 3/2009 | Thompson et al. |
| 2009/0105395 | A1 | 4/2009 | Kamata et al. |
| 2009/0272996 | A1 | 11/2009 | Chakraborty |
| 2009/0283794 | A1 | 11/2009 | Mizuno et al. |
| 2010/0059774 | A1 | 3/2010 | Hatsuda et al. |
| 2010/0200874 | A1* | 8/2010 | Shioi .................. C09K 11/0883 257/91 |
| 2010/0252851 | A1* | 10/2010 | Emerson ................. H01L 33/58 257/98 |
| 2012/0187862 | A1* | 7/2012 | Britt ........................ H01L 33/62 315/291 |

FOREIGN PATENT DOCUMENTS

| | | |
|---|---|---|
| EP | 1 927 636 A1 | 6/2008 |
| EP | 2 030 752 A1 | 3/2009 |
| JP | 61-59406 A | 3/1986 |
| JP | 2002-305328 A | 10/2002 |
| JP | 2003-224304 A | 8/2003 |
| JP | 2004-532533 A | 10/2004 |
| JP | 2005-055759 | 3/2005 |
| JP | 2009-544805 A | 12/2009 |
| JP | 2010-510671 A | 4/2010 |
| TW | 200522398 A | 7/2005 |
| TW | 200641169 A | 12/2006 |
| TW | 200916557 A | 4/2009 |
| WO | 2005/064626 A2 | 7/2005 |
| WO | 2006/089540 A2 | 8/2006 |
| WO | 2007/125785 A1 | 8/2007 |
| WO | 2008/064070 A1 | 5/2008 |

OTHER PUBLICATIONS

English translation of the Notification of Reasons for Refusal dated Feb. 9, 2015 of corresponding Japanese Patent Application No. 2013-515795.
English translation of the Final Notification of Reasons for Refusal dated Dec. 14, 2015 of corresponding Japanese Patent Application No. 2013-515795.
Zhou, Y., "One-Component, Low-Temperature, and Fast Cure Epoxy Encapsulant With High Refractive Index for LED Applications," IEEE Transactions on Advanced Packaging, vol. 31, No. 3, Aug. 2008, pp. 484-489.
Internal Reconsideration Report dated Jan. 17, 2017, of corresponding Japanese Application No. 2016-018864 in English.

* cited by examiner

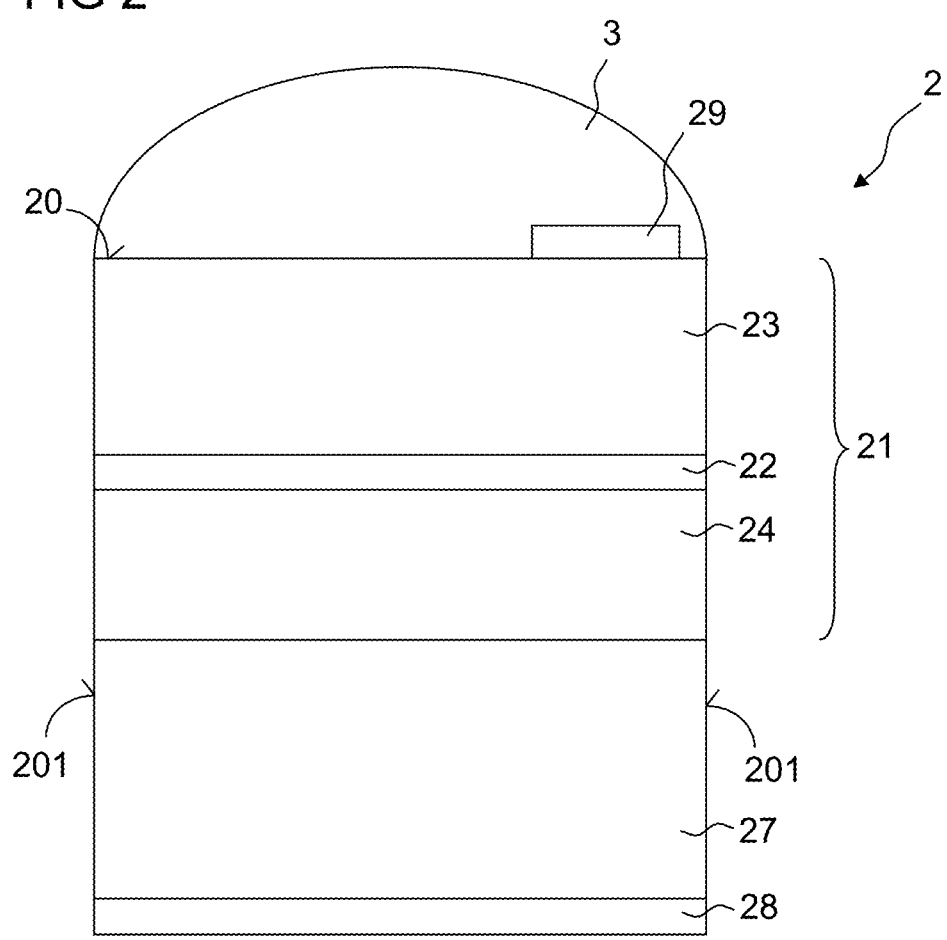

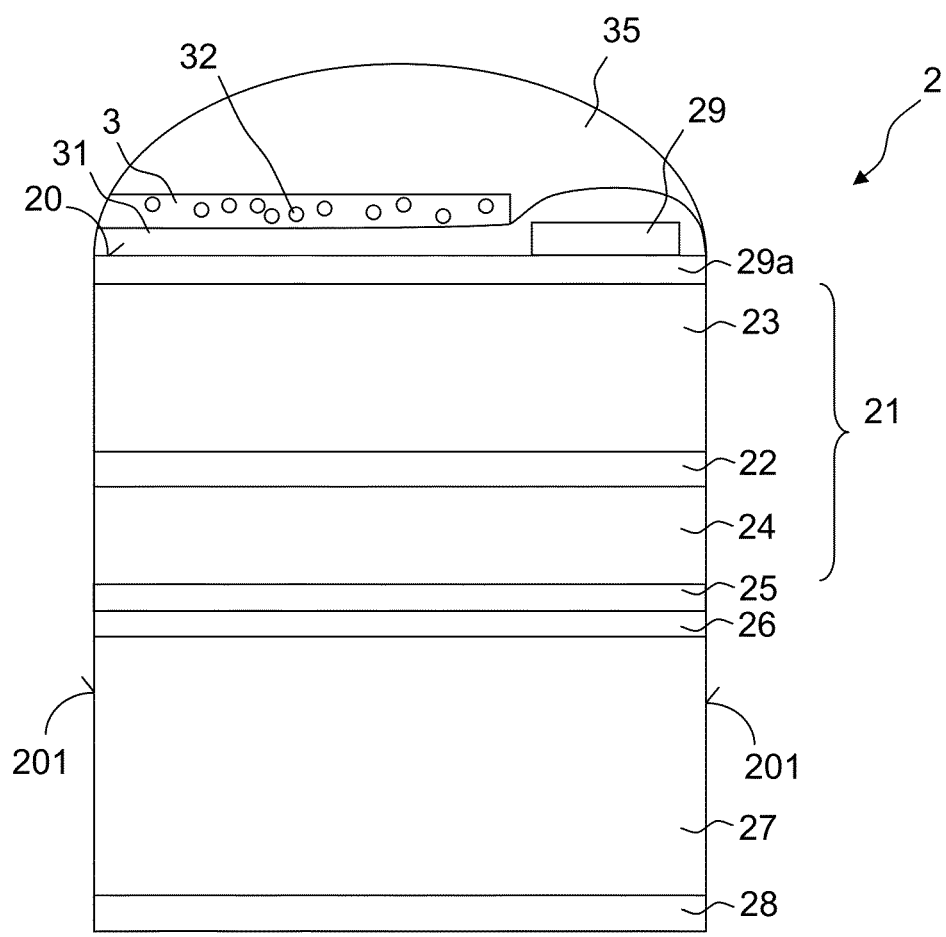

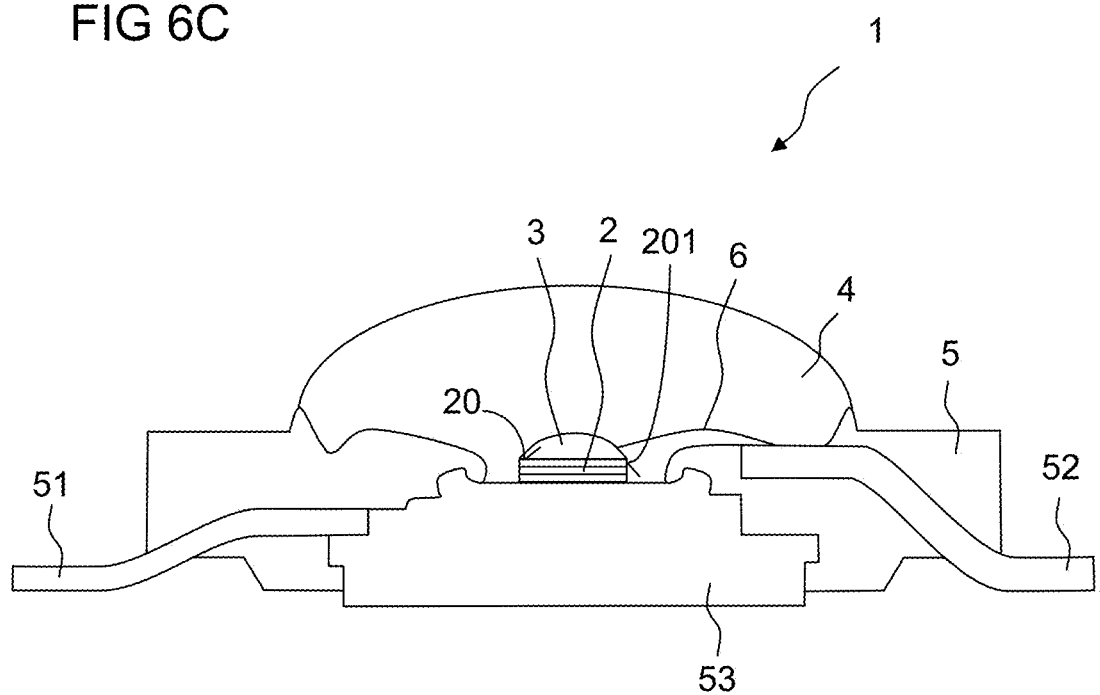

SEMICONDUCTOR COMPONENT AND METHOD OF PRODUCING A SEMICONDUCTOR COMPONENT

RELATED APPLICATIONS

This is a Divisional of U.S. application Ser. No. 13/703,180 filed Jan. 23, 2013, which is a §371 of International Application No. PCT/EP2011/058580, with an international filing date of May 25, 2011 (WO 2011/160913 A1, published Dec. 29, 2011), which is based on German Patent Application No. 10 2010 024 545.3 filed Jun. 22, 2010, the subject matter of which is incorporated herein by reference.

TECHNICAL FIELD

This disclosure relates to a semiconductor component and to a method of producing a semiconductor component.

BACKGROUND

To increase the radiation power emitted by radiation-emitting semiconductor components such as light-emitting diodes, for example, it is possible to make modifications to the semiconductor chip with regard to its layer construction or its geometry. However, this is complex and cost-intensive.

It could therefore be helpful to provide a semiconductor component in which the radiation power emitted during operation is increased. Furthermore, it could be helpful to provide a method of producing such a semiconductor component by which such components can be produced in a simplified and reliable manner.

SUMMARY

We provide a semiconductor component including an optoelectronic semiconductor chip and an optical element arranged on a radiation passage area of the semiconductor chip, wherein the optical element is based on a highly refractive polymer material.

We also provide a method of producing a semiconductor component including providing an optoelectronic semiconductor chip, applying a molding compound for an optical element, wherein the molding compound is based on a highly refractive polymer material, procuring the molding compound at a temperature of at most 50° C. and curing the molding compound.

BRIEF DESCRIPTION OF DRAWINGS

FIG. 2 shows an enlarged illustration of a semiconductor chip and of an optical element in accordance with the first example illustrated in FIG. 1.

FIG. 3 shows a second example of a semiconductor chip with an optical element in a schematic sectional view.

FIGS. 6A to 6C show an example of a method of producing a semiconductor component on the basis of intermediate steps illustrated schematically in sectional view.

DETAILED DESCRIPTION

Figure 1:
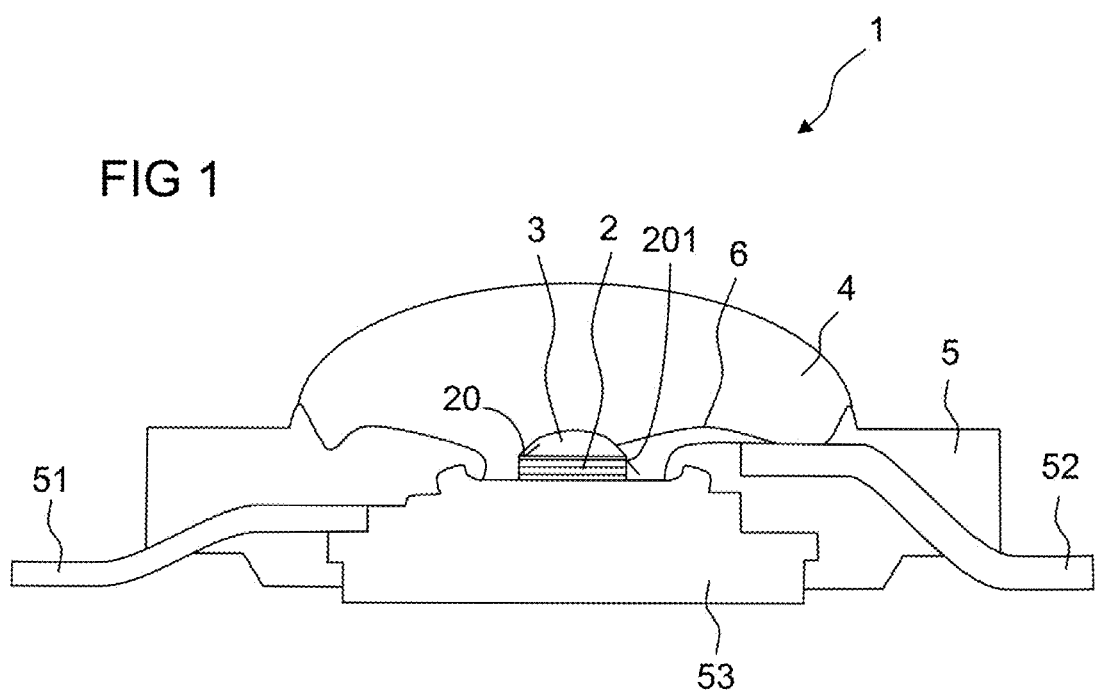
FIG. 1 shows a first example of a semiconductor component in a schematic sectional view.

Our semiconductor component may comprise an optoelectronic semiconductor chip and an optical element arranged on a radiation passage area of the semiconductor chip. The optical element is based on a highly refractive polymer material.

On account of its highly refractive property, the optical element can make an improved contribution to reducing sudden changes in refractive index between semiconductor chip and surroundings.

In this context, "based" on a highly refractive polymer material means that the highly refractive polymer material forms the basic material for the optical element. Further material can be admixed with the highly refractive polymer material as basic material, for example, luminescence conversion material to convert radiation generated in the semiconductor chip and/or diffuser material.

Preferably, the optical element contains highly refractive polymer material with a proportion by weight of at least 80%.

Nanoparticles that increase the refractive index may be provided into the highly refractive polymer material. The nanoparticles expediently have a refractive index greater than the refractive index of the highly refractive polymer material. The nanoparticles are expediently formed with regard to their average size such that they do not absorb, or at least do not significantly absorb, the radiation to be generated and/or to be received by the semiconductor component.

A highly refractive material is understood to be a material which has a refractive index of at least 1.50.

Preferably, a refractive index of the optical element, in particular the polymer material of the optical element, is at least 1.52, particularly preferably at least 1.54. Furthermore, the refractive index of the optical element is expediently less than a refractive index of the semiconductor material of the semiconductor component facing the optical element.

Preferably, the optical element contains a silicone, an epoxide or a hybrid material. By way of example, diphenylsiloxane is distinguished by a comparatively high refractive index of 1.54.

The optical element serves for the beam shaping of the radiation passing through the radiation passage area of the semiconductor chip. In this case, the beam shaping can concern, in particular, the spatial and/or the spectral emission characteristic.

In one configuration, the optical element is curved at least in regions on the side facing away from the semiconductor chip, in particular, convexly curved in a plan view of the semiconductor component. The optical element can thus fulfill the function of a radiation-concentrating lens.

The optical element preferably extends in a lateral direction at most as far as a side area of the semiconductor chip which delimits the semiconductor chip in a lateral direction. Consequently, the optical element does not project beyond the semiconductor chip in a lateral direction. In case of doubt, a lateral direction is understood to be a direction that runs along a main extension plane of the semiconductor layers of the semiconductor chip.

The side area delimiting the semiconductor chip in a lateral direction can thus be free of the material for the optical element.

In one configuration, the optical element adjoins the semiconductor chip, preferably directly. In particular, the optical element is molded onto the semiconductor chip during the production of the semiconductor component.

Alternatively, the optical element may be prefabricated and furthermore preferably fixed to the semiconductor chip by a connecting layer.

Preferably, a luminescence conversion substance is embedded into the optical element. The luminescence conversion substance is provided to at least partly absorb the radiation generated in the semiconductor chip during operation and converting it into radiation having a different wavelength.

Further preferably, a further optical element is arranged on that side of the optical element which faces away from the semiconductor chip, the further optical element being based on a highly refractive polymer material and furthermore preferably being convexly curved.

In this case, the optical element can serve for spectral beam shaping and the further optical element for spatial beam shaping.

The connecting layer arranged between the semiconductor chip and the optical element is preferably highly refractive. In particular, the refractive index of the connecting layer is preferably greater than or equal to the refractive index of the adjoining optical element. The connecting layer can be based on a highly refractive polymer material, for instance a highly refractive silicone.

Further preferably, the semiconductor component has an encapsulation into which the semiconductor chip is embedded. Preferably, the encapsulation covers the optical element at least in regions, particularly preferably completely. The encapsulation preferably directly adjoins the optical element at least in regions.

The encapsulation preferably has a refractive index less than the refractive index of the optical element and, if appropriate, of the further optical element.

Encapsulation is furthermore preferably in a lens-shaped fashion at least in regions on the side facing away from the semiconductor chip. The spatial emission characteristic of the semiconductor component can be set by the shape of the encapsulation.

In a method of producing a semiconductor component, an optoelectronic semiconductor chip may be provided. A molding compound for an optical element is applied to the semiconductor chip, wherein the molding compound is based on a highly refractive polymer material. The molding compound is precured at a temperature of at most 50° C. The molding compound is cured.

What can be achieved by the upstream precuring is that the molding compound has a sufficient dimensional stability after the precuring. The precuring can be effected, in particular, at a temperature of 10° C. to 30° C., for instance, at room temperature.

The risk of the molding compound deliquescing during the curing step is reduced by the precuring. The precuring is expediently effected such that the molding compound does not run over a side area of the semiconductor chip. An undesirable change in the shape of the optical element before the complete curing of the molding compound and an associated impairment of the quality of the optical element can thus largely be reduced.

In one configuration, the precuring is induced by electromagnetic radiation. Preferably, the precuring is effected by ultraviolet radiation. However, radiation in a different spectral range, for example, microwave radiation, can also be employed.

We found that radiation-induced curing brings about faster gelation of the molding compound. The risk of the molding compound deliquescing is thereby more extensively reduced. In the case of purely thermal curing, by contrast, temperature changes that occur in this case are able to bring about or promote deliquescing.

Preferably, the molding compound is exposed to radiation with an energy input of 0.2 J/cm$^2$ to 2.0 J/cm$^2$ during the precuring. This range has proved to be particularly suitable for the production of an optical element having a high optical quality.

Alternatively or supplementarily, the molding compound can be activated for the precuring by mixing at least two components of the molding compound. In this case, activation of the molding compound can be effected intrinsically, that is to say without further external action, and bring about precuring. This can be additionally initiated or accelerated however, for example, by electromagnetic radiation.

Further preferably, thermal curing is carried out during the curing of the molding compound.

The curing is preferably effected at a higher temperature than the precuring. On account of the precrosslinking of the molding compound during the precuring, the risk of thermally induced deliquescing during thermal curing even at comparatively high temperatures is largely reduced.

The higher the temperature during the thermal curing, the shorter the duration of the curing step can be. Preferably, the temperature is room temperature to 200° C., particularly preferably 50° C. to 150° C.

The molding compound can be applied directly to the optoelectronic semiconductor chip. Alternatively, a further layer or a further element, for example, a plate containing a luminescence conversion substance, can also be applied before the molding compound is applied, The method described is suitable, in particular, to produce a semiconductor component described further above. Features mentioned in connection with the semiconductor component can therefore also be used for the method, and vice versa.

Further configurations and expediencies will become apparent from the following description of the examples in conjunction with the figures.

Elements which are identical, of identical type or act identically are provided with the same reference signs in the figures.

The figures and the size relationships of the elements illustrated in the figures among one another should not be regarded as to scale. Rather, individual elements may be illustrated with an exaggerated size to enable better illustration and/or to afford a better understanding.

A first example of a semiconductor component is schematically illustrated in sectional view in FIG. 1. The semiconductor component 1 is by way of example a surface-mountable component (surface mounted device, SMD), for instance as a luminescence diode component.

The semiconductor component 1 comprises an optoelectronic semiconductor chip 2 and an optical element 3 arranged on a radiation passage area 20 of the semiconductor chip 2.

The semiconductor component furthermore comprises a housing body 5 molded onto a leadframe with a first contact 51 and a second contact 52. Furthermore, a thermal contact 53 is formed in the housing body 5. In contrast to the first and second contacts, the thermal contact predominantly does not serve for making electrical contact, but rather for dissipating heat generated in the semiconductor chip during operation.

During operation of the semiconductor chip 2, the first contact 51 and the second contact 52 serve to inject charge carriers into the semiconductor chip 2, in particular into an active region of the semiconductor chip provided to generate radiation. The semiconductor chip 2 is electrically conductively connected to the second contact via a connecting line 6, for example, a bonding wire. The connecting line runs outside the optical element 3 at least in regions. The connecting line can also run completely outside the optical element 3.

The semiconductor component 1 furthermore comprises an encapsulation 4. The semiconductor chip 2 and, if appropriate, the connecting line 6 are/is encapsulated by this encapsulation and thus protected against external influences, for example, moisture, dust or mechanical loads.

Furthermore, the encapsulation completely molds around the optical element 3 on the side facing away from the semiconductor chip 2.

The encapsulation 4 can, for example, contain an epoxide or a silicone or a mixture of an epoxide and a silicone or consist of such a material.

The optical element 3 is based on a highly refractive polymer material and preferably has a refractive index of at least 1.52, particularly preferably at least 1.54. In particular, the polymer material can have a refractive index of at least 1.52, preferably at least 1.54. The polymer material preferably contains a highly refractive silicone. By way of example, diphenysiloxane is distinguished by a comparatively high refractive index of 1.54. Alternatively or supplementarily, some other polymer material, for example, an epoxide or a hybrid material, for instance polyurethane, can also be employed.

Nanoparticles can furthermore be formed in the polymer material to increase the refractive index, the nanoparticles having a higher refractive index than the polymer material. The refractive index of the optical element can thereby be more extensively increased. Expediently, the nanoparticles are embodied with regard to their size such that they do not absorb or at least do not significantly absorb the radiation generated during operation of the semiconductor chip.

On the side facing away from the semiconductor chip 2, the optical element is such that it is convexly curved in a plan view of the semiconductor component 1, and thus serves for the beam concentration of the radiation generated in the semiconductor chip.

In a lateral direction, that is to say along a direction running in a main extension plane of the semiconductor layers of the semiconductor body 2, the optical element 3 does not extend beyond a side area 201 delimiting the semiconductor body in a lateral direction. The side area 201 is thus free of the material for the optical element 3.

The semiconductor chip 2 preferably contains a III-V compound semiconductor material. III-V semiconductor materials are particularly suitable to generate radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$ (phosphide compound semiconductor materials), in particular for yellow to red radiation) to the infrared ($Al_xIn_yGa_{1-x-y}As$ (arsenide compound semiconductor materials)) spectral range. Here $0 \leq x \leq 1$, $0 \leq y \leq 1$ and $x+y \leq 1$ in each case hold true, in particular where $x \neq 1$, $y \neq 1$, $x \neq 0$ and/or $y \neq 0$. With III-V semiconductor materials, in particular from the material systems mentioned, high internal quantum efficiencies can furthermore be achieved during generation of radiation.

Such semiconductor materials, in particular phosphide and arsenide compound semiconductor materials, have a comparatively high refractive index.

On account of the high refractive index of the optical element 3, the sudden change in refractive index of radiation emerging through the radiation passage area 20 is reduced in comparison with a component without such an optical element. That proportion of the radiation which remains in the semiconductor body on account of total internal reflection at the radiation passage area 20 and is not coupled out decreases as a result. In the case of a phosphide semiconductor chip 2, we found that the radiation power emitted from the component 1 can be increased by up to 16% with the optical element.

FIG. 2 shows the semiconductor chip 2 and the optical element 3 of the first example described in connection with FIG. 1 in an enlarged illustration.

The semiconductor chip 2 has a semiconductor body 21 having a semiconductor layer sequence, which is preferably deposited epitaxially, forms the semiconductor body and comprises an active region 22 provided to generate radiation, the active region being arranged between a first semiconductor region 23 of a first conduction type and a second semiconductor region 24 of a second conduction type, which is different than the first conduction type. By way of example, the first semiconductor region 23 can be p-conducting and the second semiconductor region 24 n-conducting, or vice versa.

The semiconductor body 21 is arranged on a carrier 27, wherein the carrier can be, for example, a growth substrate for the semiconductor layer sequence. A first contact layer 28 is arranged on that side of the carrier which faces away from the semiconductor body 21. A second contact layer 29 is arranged on that side 27 of the semiconductor body 21 which faces away from the carrier. The contact layers 28, 29 are provided for injecting charge carriers into the active region 22 from different sides.

The highly refractive optical element 3 is formed on the radiation passage area 20 of the semiconductor chip 2. The optical element also covers at least one part of the second contact layer 29 and furthermore also a part of the connecting line 6 (not explicitly illustrated in this figure).

In a departure from the example described, it is also possible for both contact layers 20, 21 to be formed on the same side of the semiconductor body. By way of example, the semiconductor chip can be embodied as a flip-chip such that the semiconductor chip has no contact on the side of the optical element 3. A semiconductor chip in which both contacts are arranged on the side facing the optical element can also be employed. In this case, two connecting lines can run within the optical element at least in regions.

Furthermore, the optical element 3 described is also suitable for a semiconductor chip embodied as a radiation detector.

A second example of a semiconductor component 1 is illustrated schematically in sectional view in FIG. 3. This example substantially corresponds to the first example described in connection with FIGS. 1 and 2. In particular, the semiconductor chip 2 can be arranged in a housing body of a surface-mountable component, as described in connection with FIG. 1.

However, the semiconductor chip, in the same way as the semiconductor chip illustrated in FIG. 2, can also be arranged in a different housing form, for example, in a housing with radial geometry.

In contrast to the first example, the optical element 3 is a plate in which a luminescence conversion substance 32 is embedded.

A connecting layer 31 is arranged between the optical element 3 and the semiconductor chip 2 by which connecting layer the optical element 3 is fixed to the semiconductor chip. The optical element is therefore already prefabricated in this example.

The connecting layer 31 is preferably likewise highly refractive. Particularly preferably, the refractive index of the connecting layer 31 is greater than or equal to the refractive index of the optical element 3. The connecting layer 31 is furthermore preferably based on a highly refractive polymer material, for example, a highly refractive silicone.

A further optical element 35 is formed on that side of the optical element 3 which faces away from the semiconductor chip 2. The further optical element 35 is preferably likewise based on a highly refractive polymer material, for instance silicone, and serves for the beam shaping of the radiation emerging from the semiconductor chip 2.

With the connecting layer 31 and the optical element 3, a sudden change in refractive index for the radiation emerging from the semiconductor chip 2 is reduced such that the radiation power emerging from the semiconductor chip can be increased. The further optical element 35 serves to further increase the coupling-out of radiation and spatial beam shaping. However, the further optical element 35 can also be dispensed with.

The luminescence conversion substance 32 in the optical element 3 is provided for the at least partial conversion of radiation generated in the active region 22 of the semiconductor body 21 during operation.

The optical element 3 with the connecting layer 31 can also be employed for a semiconductor chip in the first example described in connection with FIG. 2.

In contrast to the semiconductor chip illustrated in FIG. 2, the semiconductor chip in accordance with the second example illustrated in FIG. 3 has a carrier 27 that is different than a growth substrate for the semiconductor layer sequence of the semiconductor body 21. The carrier 27 can, for example, contain a semiconductor material, for instance silicon, gallium arsenide or germanium, or a ceramic, for instance aluminum nitride or boron nitride, or consist of such a material. The semiconductor body 21 is fixed to the carrier by a mounting layer 26. By way of example, an adhesive layer or a solder layer is suitable for the mounting layer.

The carrier 27 mechanically stabilizes the semiconductor body 21. The growth substrate is no longer necessary for this purpose and can be thinned or removed at least in regions or completely. A semiconductor chip in which the growth substrate is removed is also designated as a thin-film semiconductor chip.

On the side facing away from the radiation passage area 20 of the semiconductor chip, the semiconductor body 21 has a mirror layer 25, which reflects radiation emitted in the direction of the carrier 27 toward the radiation passage area. The mirror layer 25 is expediently highly refractive to the radiation generated in the active region 22 and furthermore has a high reflectivity that is largely independent of the impingement angle of the radiation. The mirror layer preferably contains a metal, for example, silver, rhodium, aluminum or chromium or a metallic alloy comprising at least one of the materials mentioned.

Furthermore, a distribution layer 29a is formed between the semiconductor body 21 and the second contact layer 29. The distribution layer 29a is provided for injection of charge carriers, the injection being uniform in a lateral direction, via the first semiconductor region 23 into the active region 22.

Given a sufficiently high transverse conductivity of the first semiconductor region 23, however, the distribution layer 29a can also be dispensed with.

The distribution layer 29a is expediently transparent or at least translucent to the radiation generated in the active region 22. By way of example, the distribution layer 29a can contain a transparent conductive oxide (TCO), for instance indium tin oxide (ITO) or zinc oxide (ZnO). Alternatively or supplementarily, it is also possible to employ a metal layer which is so thin that the radiation can at least partly pass through.

The semiconductor body 21, in particular the active region 22, can be based on a nitride semiconductor material, for example, and can be provided to generate blue or ultraviolet radiation. Together with the radiation converted in the optical element 3 by the luminescence conversion substance 32, it is thus possible to form an integrated mixed light source, for example, a white light source. For a component comprising such a semiconductor chip, an increase in the radiation power on account of the optical element 3 of approximately 5% was observed.

Figure 4A:
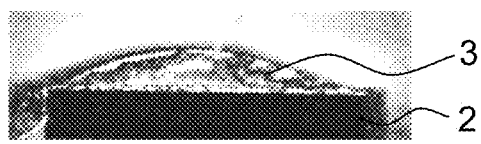
FIGS. 4A to 4E show illustrations of five examples of an optical element in each case in a sectional view.
Figure 4B:
Figure 4C:
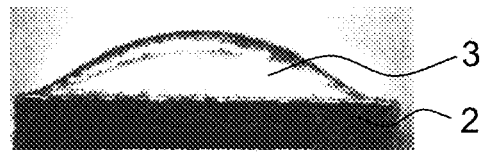
Figure 4D:
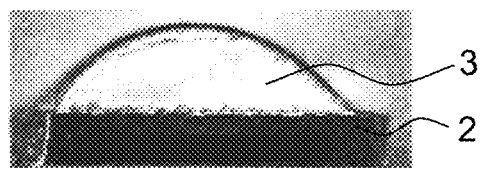
Figure 4E:
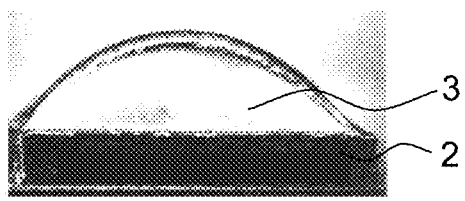

FIGS. 4A to 4E show different examples of an optical element 3 on a semiconductor chip 2. The optical elements differ in the quantity of material used during production. In the figures, the quantity of material used is four quantitative units (FIG. 4A), five quantitative units (FIG. 4B), seven quantitative units (FIG. 4C), ten quantitative units (FIG. 4D) and 13 quantitative units (FIG. 4E).

The figures show that as the quantity of material increases, the height of the optical element 3, that is to say the extent perpendicular to the semiconductor chip, can be increased. In these examples, the height is 157 µm, 175 µm, 241 µm, 301 µm and 365 µm, respectively.

The figures furthermore show that the molding compound used during production for the optical element 3 remains completely on the radiation passage area of the semiconductor chip 2 and does not run beyond the side areas of the semiconductor chip. It is thus possible to realize optical elements whose side facing away from the semiconductor chip comes close to a shape having spherical curvature.

Figure 5:
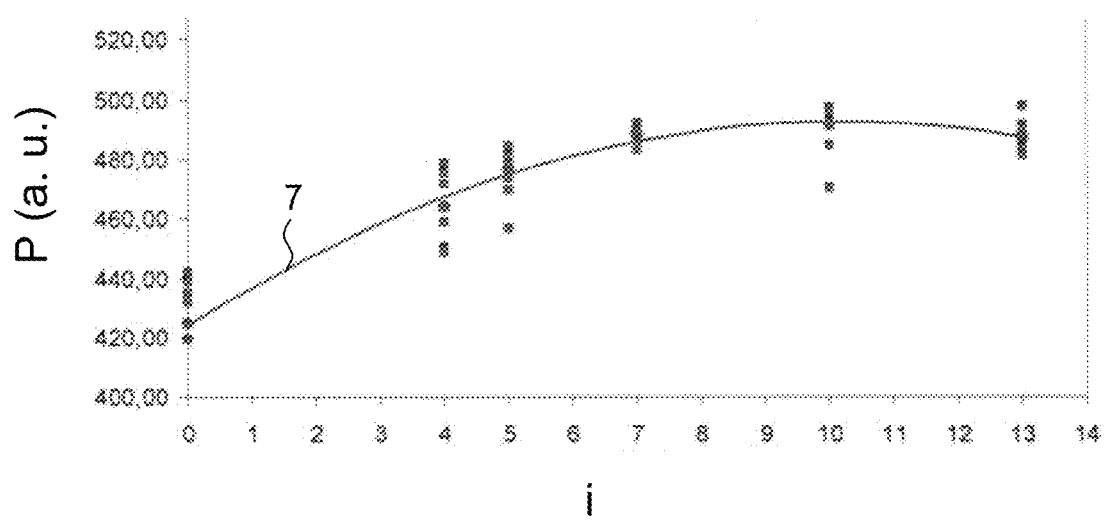
FIG. 5 shows a measurement of the radiation power P (in arbitrary units) emitted by semiconductor components as a function of the weight of the optical element in multiples i of a predefined quantity of material.

The influence of the size of the optical element 3 for the examples illustrated in FIGS. 4A to 4E is illustrated in FIG. 5, wherein the emitted radiation power P in arbitrary units is illustrated as a function of the quantity of material used in multiples i of a predefined quantitative unit.

The measured values for i=0 represent a reference measurement for a structurally identical component without a highly refractive optical element.

The curve 7 illustrates a polynomial fit to the measured values. The measurements show that the radiation power P first increases as the size of the optical element 3 increases. A maximum of the radiation power is obtained for i=10, the power curve having a comparatively flat maximum. Similarly high output powers are thus obtained in the range of i=7 to i=13. The greater the number of quantitative units i, the greater the extent to which the shape of the optical element approximates to a spherically curved curve shape. However, with an increasing number of quantitative units, the required quantity of material increases, which leads to higher production costs.

Figure 6A:
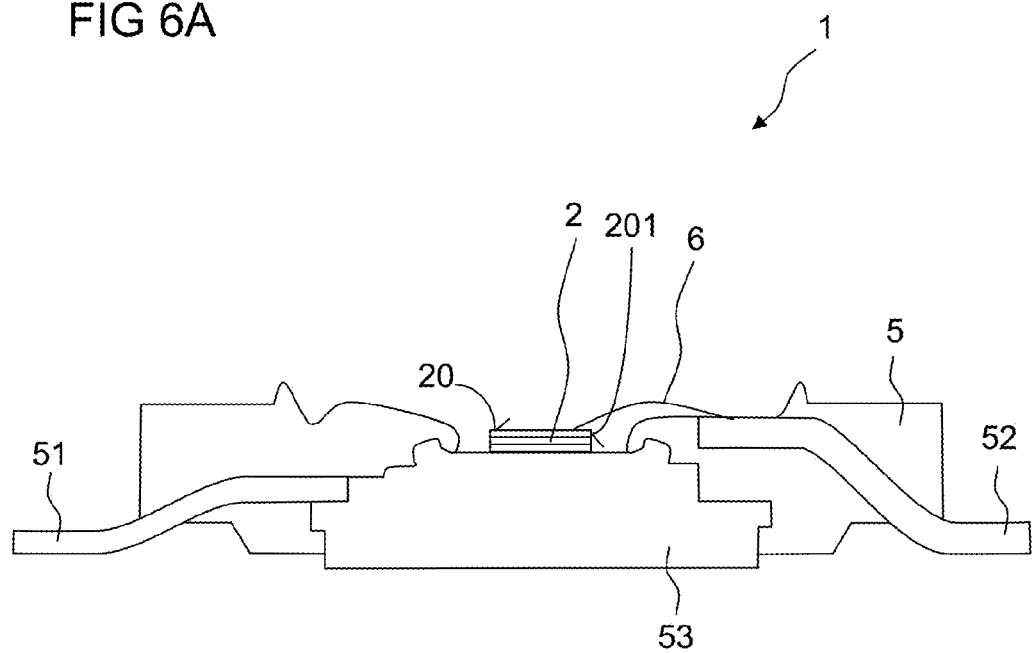
Figure 6B:
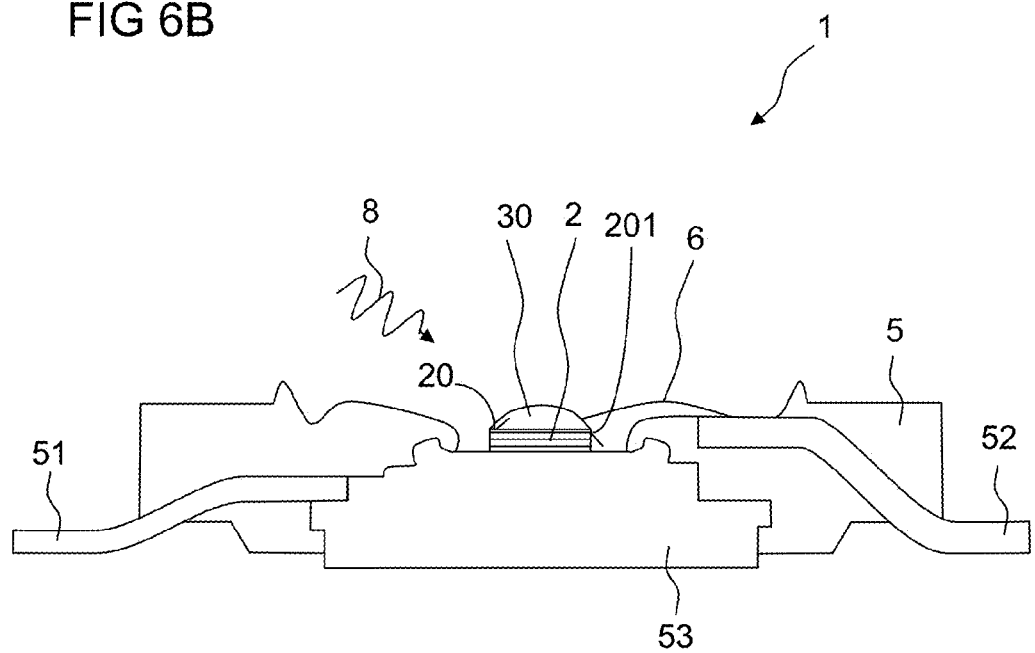

An example of a method of producing a semiconductor component is shown in FIGS. 6A to 6C on the basis of intermediate steps illustrated schematically in sectional view. The method is illustrated merely by way of example for producing a semiconductor component in accordance with the first example described in connection with FIGS. 1 and 2.

As illustrated in FIG. 6A, an optoelectronic semiconductor chip is provided. The optoelectronic semiconductor chip can, in particular, already be fixed on a connection carrier or in a housing for a surface-mountable component.

A molding compound 30 for an optical element is applied to the semiconductor chip 2, the molding compound being based on a highly refractive silicone. The molding compound is precured at a temperature of at most 50° C., preferably at a temperature of 10° C. to 30° C. In this example, precuring is effected by electromagnetic radiation, in particular radiation in the ultraviolet spectral range. As a result of precuring at comparatively low temperatures, the molding compound experiences precrosslinking such that the molding compound acquires an at least temporarily sufficient dimensional stability.

The molding compound is furthermore preferably self-adhesive. Reliable application of the molding compound is thereby simplified.

The molding compound is subsequently cured. The curing can be effected as thermal curing, for example, the temperature preferably being higher than the temperature during precuring. Thermal curing can already occur at room temperature. The higher the temperature, the faster the curing process takes place. In particular starting from a temperature of 50° C., the curing process is significantly accelerated. The temperature is preferably 50° C. to 150° C. In this curing step, it is possible to set the properties of the optical element to be produced, for example, the degree of crosslinking, elasticity and/or hardness of the optical element.

In contrast to purely thermal curing, the precuring by electromagnetic radiation upstream of the curing brings about no deliquescing or at least greatly reduced deliquescing of the molding compound 30 such that optical elements of high quality can be produced with a high reproducibility. The geometrical shaping of the optical element 3 can be varied within wide limits. In particular it is possible to produce optical elements which have a high aspect ratio, that is to say a high ratio of height to width.

The energy input of the radiation is preferably 0.2 J/cm$^2$ to 2.0 J/cm$^2$ during precuring.

The input of the electromagnetic radiation in the ultraviolet spectral range is illustrated by an arrow 8 in FIG. 6B. Alternatively, however, it is also possible to employ radiation in a different spectral range, for example, microwave radiation.

In a departure from the example described, precuring can also be induced by mixing at least two components of the molding compound 30. In this case, therefore, precuring can be induced without a further external pulse.

Furthermore, instead of the highly refractive silicone, it is also possible to employ some other highly refractive polymer material, for example, an epoxide or a hybrid material.

In this example, the molding compound 30 is applied after electrical contact has already been made with the semiconductor chip 2 by the connecting line 6. The molding compound 30 therefore also molds around a part of the connecting line 6.

The method described can be used to produce semiconductor components comprising optical elements which, on account of their high refractive index, bring about an increase in the coupling-out efficiency from the semiconductor chip and at the same time can be produced particularly reliably with regard to their shape, without the material for the optical element running over the side area of the semiconductor chip 2.

Consequently, in addition to increasing the radiation power emerging overall from the semiconductor chip, geometrical beam shaping that can be set reliably and reproducibly can also be obtained.

In particular, the method is distinguished by a high reliability not only when applying the molding compound 30 directly on semiconductor material, but also on surfaces that can be provided with an optical element only with difficulty by conventional methods, for example, on a silicone layer.

Our components and methods are not restricted by the description on the basis of the examples. But rather, the disclosure encompasses any novel feature and also any combination of features, which in particular includes any combination of features in the appended claims, even if the feature or combination itself is not explicitly specified in the claims or the examples.

What is claimed is:

1. A method of producing a semiconductor component comprising:
    a) providing an optoelectronic semiconductor chip;
    b) applying a molding compound for an optical element, wherein the molding compound is based on a highly refractive polymer material;
    c) precuring the molding compound at a temperature of at most 50° C.; and
    d) curing the molding compound.

2. The method according to claim 1, wherein the precuring is induced by electromagnetic radiation.

3. The method according to claim 2, wherein the molding compound is exposed to radiation with an energy input of 0.2 J/cm$^2$ to 2.0 J/cm$^2$ in step c).

4. The method according to claim 1, wherein the molding compound is activated by mixing at least two components of the molding compound in step c).

5. The method according to claim 1, wherein step d) is carried out at a higher temperature than step c).

6. The method according to claim 1, wherein thermal curing is carried out in step d).

* * * * *